(12) United States Patent
Choi (10) Patent No.: US 12,243,853 B2
(45) Date of Patent: Mar. 4, 2025

(54) STACK PACKAGE INCLUDING CORE DIE STACKED OVER A CONTROLLER DIE

(71) Applicant: SK hynix Inc., Icheon-si (KR)

(72) Inventor: Bok Kyu Choi, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/479,280

(22) Filed: Oct. 2, 2023

(65) Prior Publication Data
US 2024/0030191 A1 Jan. 25, 2024

Related U.S. Application Data

(62) Division of application No. 17/072,959, filed on Oct. 16, 2020, now Pat. No. 11,798,917.

(30) Foreign Application Priority Data

May 20, 2020 (KR) .................. 10-2020-0060509

(51) Int. Cl.
*H01L 23/538* (2006.01)
*G11C 5/06* (2006.01)
*H01L 25/065* (2023.01)
*H01L 25/10* (2006.01)

(52) U.S. Cl.
CPC ............ *H01L 25/0657* (2013.01); *G11C 5/06* (2013.01); *H01L 23/5384* (2013.01)

(58) Field of Classification Search
CPC ..... H01L 2924/15311; H01L 2924/181; H01L 2224/16225; H01L 2224/16145; H01L 2225/06513; H01L 2225/06517; H01L 2225/06527; H01L 2225/06568; H01L 2225/06586; G11C 5/06; G11C 5/025
See application file for complete search history.

(56) References Cited

U.S. PATENT DOCUMENTS 9,147,672 B1 9/2015 Chen
11,068,342 B1 7/2021 Alrod et al.
11,456,245 B2 * 9/2022 Tsou ................... H01L 23/147
(Continued)

FOREIGN PATENT DOCUMENTS

KR 1020120014952 A 2/2012
KR 1020150045843 A 4/2015
(Continued)

*Primary Examiner* — Mary A Wilczewski
*Assistant Examiner* — Tsz K Chiu
(74) *Attorney, Agent, or Firm* — WILLIAM PARK & ASSOCIATES LTD.

(57) ABSTRACT

A stack package includes a core die disposed over a package substrate, and a controller die disposed between the core die and the package substrate to control the core die. The core die includes banks each including memory cell arrays, an interbank region in which row decoders and column decoders are arranged, and a pad region in which first connection pads electrically connected to the row decoders and column decoders through first wirings are disposed. The controller die includes a through via region in which controller die through vias penetrating the controller die to be connected to the first connection pads are disposed, and a circuit region in which controlling circuitry electrically connected to the controller die through vias through second wirings is disposed.

10 Claims, 11 Drawing Sheets

(56) References Cited

U.S. PATENT DOCUMENTS

| | | | |
|---|---|---|---|
| 11,769,731 B2* | 9/2023 | Yu | H01L 23/49838 257/690 |
| 2004/0257847 A1 | 12/2004 | Matsui et al. | |
| 2007/0061614 A1 | 3/2007 | Choi | |
| 2009/0052218 A1 | 2/2009 | Kang | |
| 2010/0102428 A1 | 4/2010 | Lee et al. | |
| 2011/0095439 A1 | 4/2011 | Chin | |
| 2012/0018885 A1 | 1/2012 | Lee et al. | |
| 2012/0248439 A1 | 10/2012 | Lee | |
| 2013/0043584 A1 | 2/2013 | Kwon et al. | |
| 2013/0161812 A1* | 6/2013 | Kim | H01L 25/0652 257/737 |
| 2014/0071652 A1* | 3/2014 | McShane | H01L 25/04 361/820 |
| 2014/0077391 A1 | 3/2014 | Kikuchi et al. | |
| 2014/0181458 A1 | 6/2014 | Loh et al. | |
| 2014/0284780 A1 | 9/2014 | Kinoshita | |
| 2015/0069624 A1* | 3/2015 | Pham | H01L 25/0652 438/109 |
| 2015/0113195 A1 | 4/2015 | Kim | |
| 2015/0179285 A1 | 6/2015 | Kilmer et al. | |
| 2016/0293513 A1* | 10/2016 | Hiruta | H01L 23/3128 |
| 2018/0095127 A1 | 4/2018 | Pappu et al. | |
| 2019/0180807 A1 | 6/2019 | Louie et al. | |
| 2019/0181092 A1 | 6/2019 | Hsiung et al. | |
| 2020/0243448 A1 | 7/2020 | Qian et al. | |
| 2020/0294921 A1* | 9/2020 | Liu | H01L 25/50 |
| 2020/0364600 A1 | 11/2020 | Elsherbini et al. | |
| 2021/0183775 A1 | 6/2021 | Lim et al. | |
| 2021/0249380 A1* | 8/2021 | Chen | H01L 25/105 |
| 2021/0375741 A1* | 12/2021 | Tsou | H01L 23/3128 |
| 2023/0095134 A1* | 3/2023 | Chen | H01L 25/50 257/668 |

FOREIGN PATENT DOCUMENTS

| | | |
|---|---|---|
| KR | 1020150099759 A | 9/2015 |
| KR | 1020190050781 A | 5/2019 |
| KR | 1020190105346 A | 9/2019 |

* cited by examiner

STACK PACKAGE INCLUDING CORE DIE STACKED OVER A CONTROLLER DIE

CROSS-REFERENCE TO RELATED APPLICATIONS

The present application is a divisional application of U.S. patent application Ser. No. 17/072,959, filed on Oct. 16, 2020, and claims priority under 35 U.S.C 119(a) to Korean Application No. 10-2020-0060509, filed on May 20, 2020, which is incorporated herein by references in its entirety.

BACKGROUND

1. Technical Field

The present disclosure generally relates to a semiconductor package technology and, more particularly, to a stack package including a core die stacked over a controller die.

2. Related Art

Various attempts have been made to integrate a plurality of semiconductor chips into a single package structure. Attempts have been made to stack semiconductor dies vertically to form a stack package. The stacked semiconductor dies may be configured with the same type of die structure that performs the same function.

The semiconductor die may include memory cell arrays and control circuits for controlling the memory cell arrays. In order to connect the stacked semiconductor dies and a package substrate to each other, various types of interposing interconnection structures may be introduced between the semiconductor dies and the package substrate.

SUMMARY

A stack package according to an embodiment may include a core die disposed over a package substrate, and a controller die disposed between the core die and the package substrate to control the core die.

The core die may include banks each including memory cell arrays, an interbank region in which row decoders and column decoders are arranged, and a pad region in which first connection pads electrically connected to the row decoders and column decoders through first wirings are disposed.

The controller die may include a through via region in which controller die through vias penetrating the controller die to be connected to the first connection pads are disposed, and a circuit region in which controlling circuitry electrically connected to the controller die through vias through second wirings is disposed.

A stack package according to another embodiment may include a first core die disposed over a package substrate, a second core die disposed over the first core die, and a controller die disposed between the first core die and the package substrate, and controlling the first and second core dies.

The first core die may include first banks each including first memory cell arrays, a first pad region in which first connection pads and first core die through vias are arranged, and a first interbank region in which first row decoders and first column decoders electrically connected to the first connection pads through first wirings, second connection pads electrically connected to the first row decoders and first column decoders, and second core die through vias are arranged.

The controller die may include a through via region in which controller die through vias penetrating the controller die to be connected to the first connection pads are disposed; and a circuit region in which controlling circuitry electrically connected to the controller die through vias through second wirings are disposed.

DETAILED DESCRIPTION

The terms used herein may correspond to words selected in consideration of their functions in presented embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third," etc. may be used herein to describe various elements, these elements should not be limited by these terms. These terms are only used to distinguish one element from another element, but not used to indicate a particular sequence or number of elements.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom," and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

Semiconductor packages, in accordance with various embodiments, may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips, application specific integrated circuits (ASIC) chips, application processors (APs), graphic processing units (GPUs), central processing units (CPUs) or system-on-chips (SoCs). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor packages may be employed in communication systems such as mobile phones, electronic systems associated with biotechnology or health care, or wearable electronic systems. The semiconductor packages may be applicable to internet of things (IoT).

Same reference numerals refer to same elements throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

Figure 1:
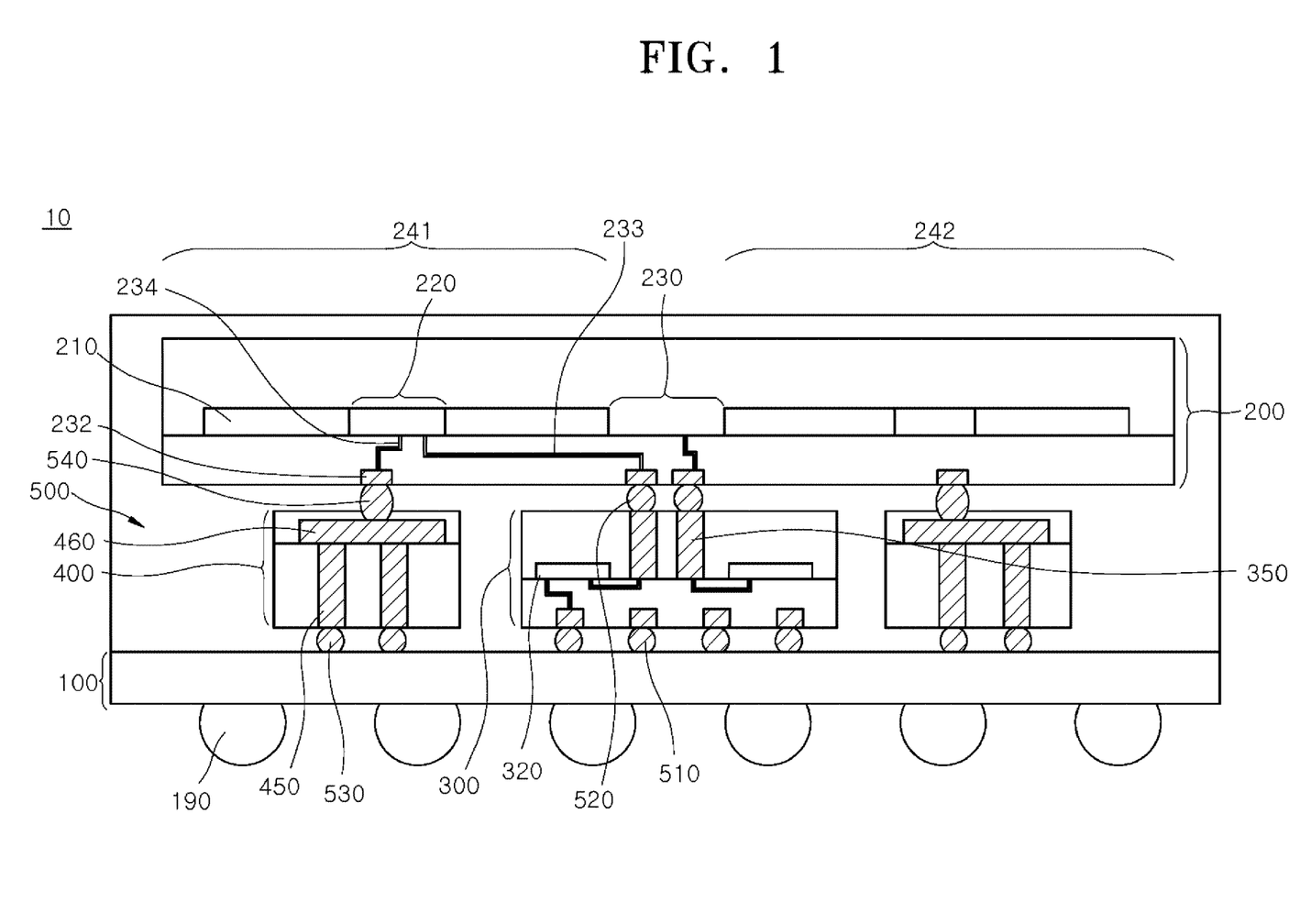
FIG. 1 is a cross-sectional view illustrating a stack package according to an embodiment of the present disclosure.

FIG. 1 is a cross-sectional view illustrating a stack package 10 according to an embodiment. Referring to FIG. 1, the stack package 10 may include a package substrate 100, a core die 200, a controller die 300, bridge dies 400, and an encapsulant 500. The core die 200 may be disposed over the package substrate 100, and the controller die 300 may be disposed between the core die 200 and the package substrate 100. The core die 200 may be substantially vertically stacked over the controller die 300. The bridge dies 400 may be disposed over the package substrate 100. The bridge dies 400 may be disposed between the core die 200 and the package substrate 100. The bridge dies 400 may be spaced apart from the controller die 300 in the horizontal direction. A plurality of bridge dies 400 may be disposed on the left and right sides of the controller die 300 interposed therebetween.

The package substrate 100 may include interconnection circuit members electrically connecting the core die 200 or the controller die 300 to an external module or an external component. The package substrate 100 may be introduced in the form of a printed circuit board (PCB), an interposer, or a multi-layer interconnection structure. Outer connectors 190 may be attached to a surface of the package substrate 100. The outer connector 190 may be a connection member in the form of a conductive bump or a solder ball.

First inner connectors 510 may be introduced between the package substrate 100 and the controller die 300 to electrically connect the controller die 300 to the package substrate 100. Second inner connectors 520 may be introduced between the core die 200 and the controller die 300 to electrically connect the core die 200 to the controller die 300. Third inner connectors 530 may be introduced between the package substrate 100 and the bridge dies 400 to electrically connect the bridge dies 400 to the package substrate 100. Fourth connectors 540 may be introduced between the package substrate 100 and the bridge dies 400 to electrically connect the core die 200 to the bridge dies 400. Each of the first to fourth connectors 510, 520, 530, and 540 may be introduced in the form of a conductive bump.

The encapsulant 500 may be disposed to cover another surface of the package substrate 100 and to cover the core die 200, the controller die 300, and the bridge dies 400. The encapsulant 500 may include an encapsulating material such as an epoxy molding compound (EMC).

Figure 2:
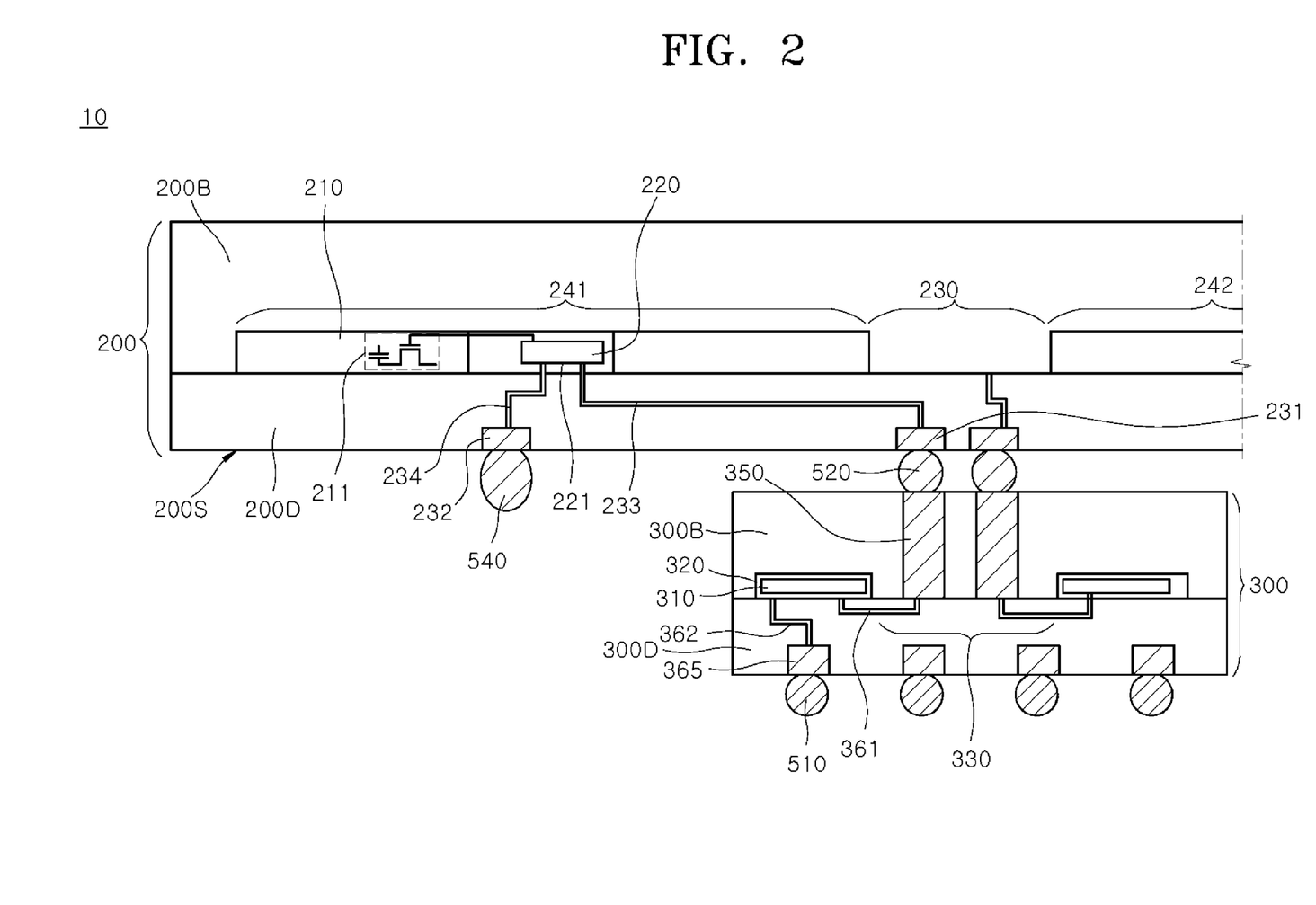
FIG. 2 is a cross-sectional view illustrating the enlarged core die and controller die of the stack package of FIG. 1.

FIG. 2 is a cross-sectional view illustrating the enlarged core die 200 and controller die 300 of the stack package 10 of FIG. 1.

Referring to FIG. 2, the core die 200 may be a memory semiconductor die in which data is stored. The controller die 300 may be other semiconductor die including controlling circuitries 310 that control the operations of storing data in the core die 200 and reading out the stored data. The core die 200 and the controller die 300 may constitute one memory device.

Figure 3:
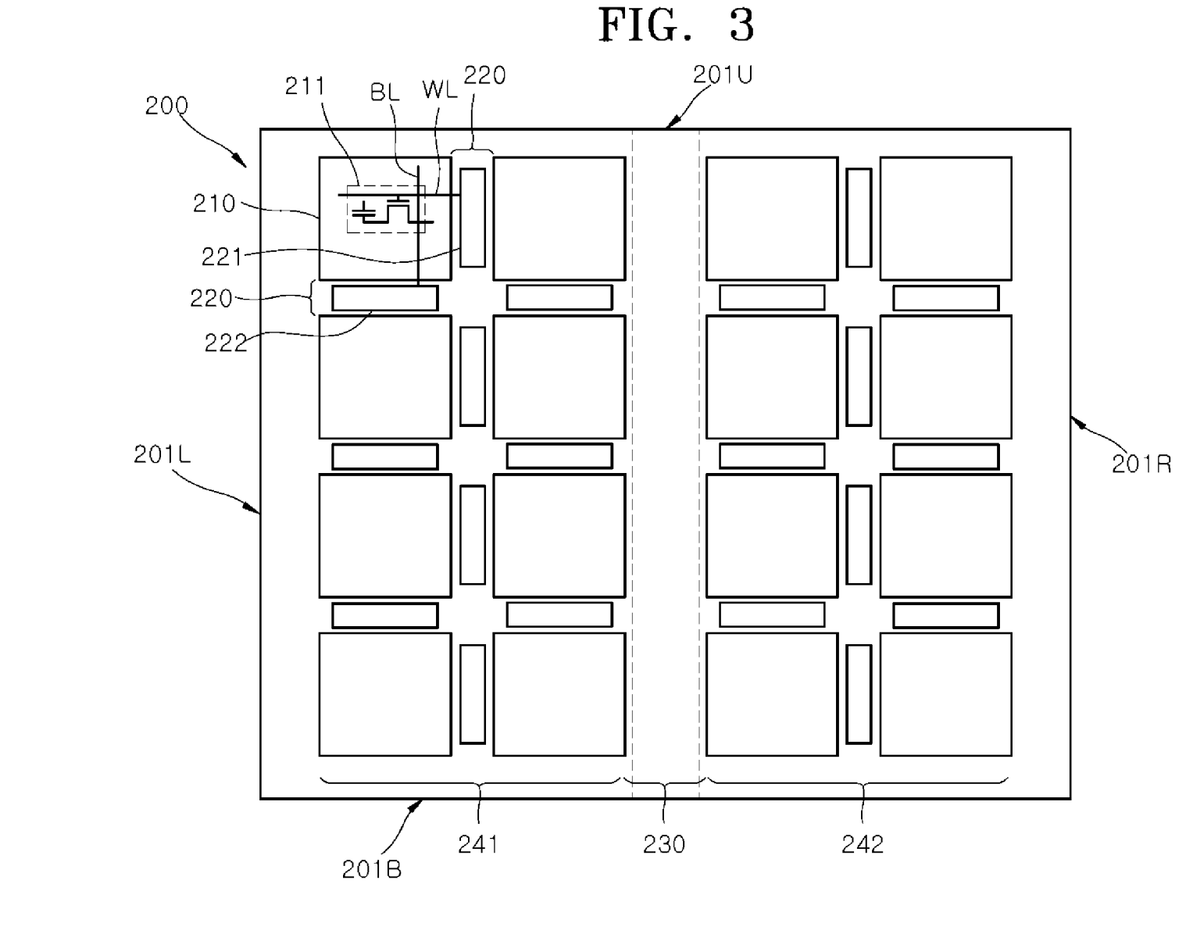
FIG. 3 is a plan view illustrating the arrangement of banks and a pad region of the core die of FIG. 2.

FIG. 3 is a plan view illustrating the arrangement of banks 210 and a pad region 230 of the core die 200 of FIG. 2.

Referring to FIG. 3 together with FIG. 2, the core die 200 may be a semiconductor die including banks 210, interbank regions 220, which are spaces between the banks 210, and a pad region 230. The interbank regions 220 may be regions having a lattice shape. The plurality of banks 210 and the interbank regions 220 may constitute a first core region 241.

The first core region 241 and a second core region 242 may be disposed side by side, and the pad region 230 may be disposed between the first core region 241 and the second core region 242. The core die 200 may have a rectangular shape including two first sides 201U and 201B facing each other and two second sides 201L and 201R facing each other while connecting the first sides 201U and 201B. The pad region 230 may be a region extending in a line shape to be long to connect the first sides 201U and 201B while being spaced apart from the second sides 201L and 201R. The banks 210 and the interbank regions 220 may be disposed between the pad region 230 and the second sides 201L and 201R.

Each of the banks 210 may include a memory cell array. The memory cell array may include a plurality of memory cells 211 arranged in a matrix form. The memory cell 211 may include a DRAM cell. The memory cell 211 may include a transistor element and a storage unit. The storage unit may include a capacitor element.

Row decoders 221 and column decoders 222 may be disposed in the interbank region 220. The row decoders 221 and the column decoders 222 may be integrated in locations adjacent to the memory cell array to access a specific memory cell 211 of the memory cell array. Each of the row decoders 221 and column decoders 222 may include a circuit including a plurality of switches. The memory cell array may include memory cells 211 each positioned at an intersection of a word line WL and a bit line BL. The row decoder 221 may select a specific word line WL in response to a received row address signal, and the column decoder 222 may select a specific bit line BL in response to a received column address signal.

Figure 4:
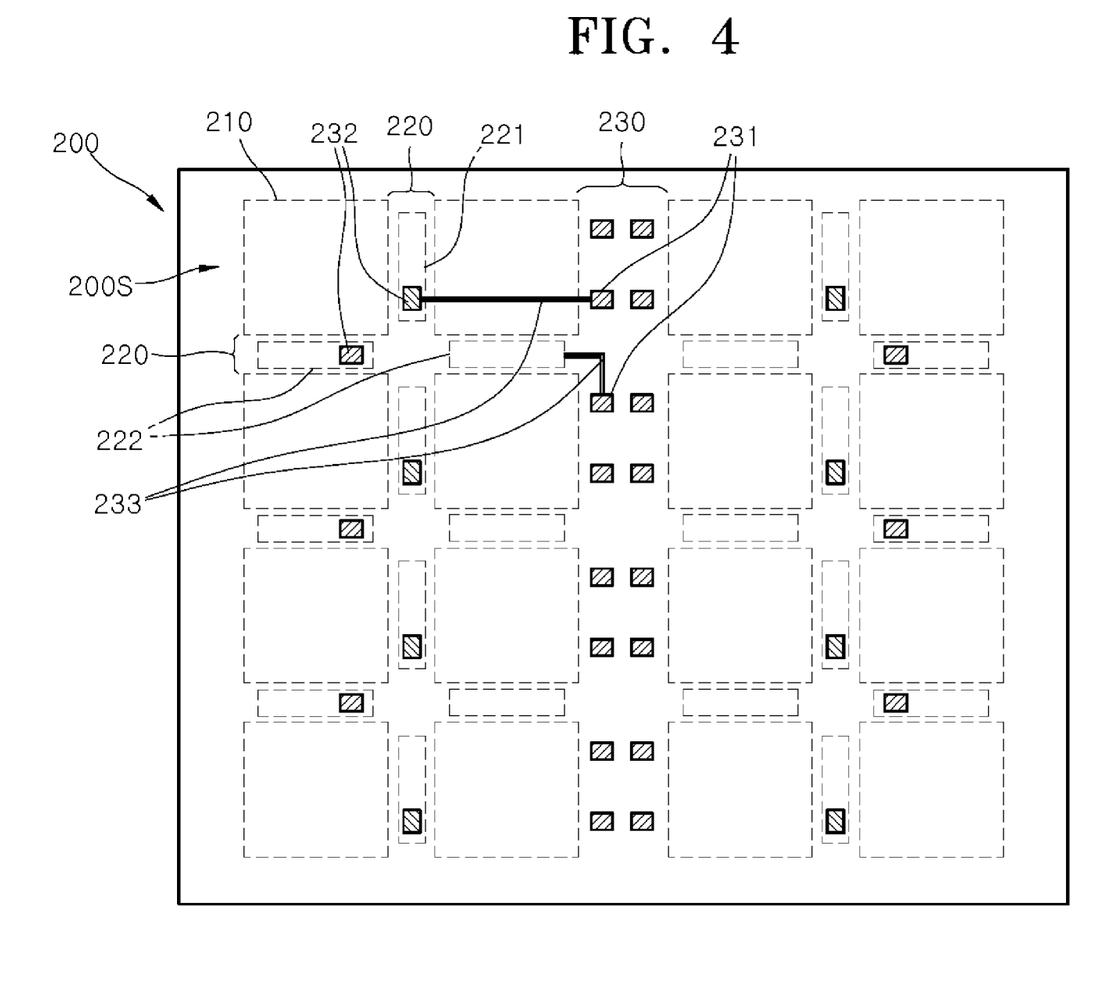
FIG. 4 is a plan view illustrating the arrangement of connection pads of the core die of FIG. 2.

FIG. 4 is a plan view illustrating the arrangement of the connection pads 231 and 232 of the core die 200 of FIG. 2.

Referring to FIG. 4 and FIG. 2, the pad region 230 may be a region in which the first connection pads 231 are arranged. The first connection pads 231 may be connection pads that are electrically and directly connected to the controller die 300 without interposing another die. The first connection pads 231 may be electrical terminals electrically connected to the controller die 300. The first connection pads 231 may be disposed on a surface 200S of the core die 200 facing the controller die 300 so that the second inner connectors 520 are attached to the first connection pads 231, respectively.

The first connection pads 231 may be positioned to overlap the second inner connectors 520. The first connection pads 231 may be positioned to overlap the controller die 300. The first connection pads 231 may be positioned in the pad region 230 so as not to overlap the banks 210. When the first connection pads 231 overlap the banks 210, there is a fear that defects may be caused in the memory cells 211 integrated in the banks 210 by the impact of attaching the second inner connectors to the first connection pads. Because the circuit elements or the memory cells are not disposed in the pad region 230 in which the first connection pads 231 are disposed, it is possible to effectively suppress or prevent the occurrence of defects in the circuit elements integrated in the core die 200 in the process of attaching the second inner connectors 520 to the first connection pads 231.

The control signals provided by the controller die 300 may be transferred to the row decoders 221 and the column decoders 222. The first connection pads 231 may be electrically connected to the row decoders 221 and the column decoders 222, respectively, through first wirings 233. Some of the first wirings 233 may include conductive patterns extending across the banks 210 to be connected to the column decoders 222.

Referring to FIG. 4 together with FIGS. 1 and 2, the second connection pads 232 may be disposed in the interbank region 220 as other connection pads separated from the first connection pads 231. The second connection pads 232 may be connection pads electrically and directly connected to the bridge dies 400 without interposing another die. Each of the second connection pads 232 may be an electrical terminal electrically connected to the bridge die 400. The second connection pads 231 may be arranged to overlap the fourth inner connectors 540 and the bridge dies 400 so that the fourth inner connectors 540 are respectively attached to the second connection pads 232. The second connection pads 232 may be electrically connected to the row decoders 221 and the column decoders 222 through the fourth wirings 234, respectively. The "first, and fourth" of the first wiring 233 and the fourth wiring 234 are for distinguishing the same from each other rather than referring to the order.

Referring to FIGS. 2 and 4, the core die 200 may include a core die body 200B and a core die dielectric layer 200D. The core die dielectric layer 200D may be disposed to cover the core die body 200B. The memory cells 211, the row decoders 221, and the column decoders 222 may be integrated in the core die body 200B. The first wirings 233 and the fourth wirings 234 may be positioned in the core die dielectric layer 200D. The first wirings 233 and the fourth wirings 234 may be formed in a multilayer metallization structure. One surface of each of the first connection pads 231 and second connection pads 232 may be exposed by the core die dielectric layer 200D.

Figure 5:
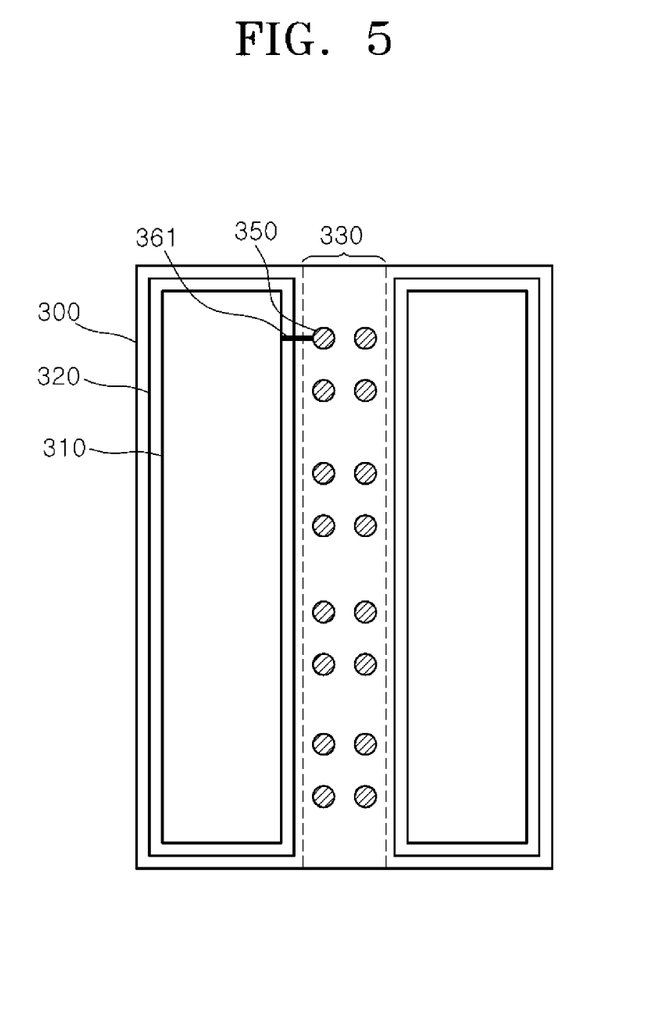
FIG. 5 is a plan view illustrating the arrangement of a circuit region and a through via region of the controller die of FIG. 2.

FIG. 5 is a plan view illustrating the arrangement of circuit regions 320 and a through via region 330 of the controller die 300 of FIG. 2.

Referring to FIGS. 2 and 5, the controller die 300 may be disposed to vertically overlap the core die 200. The controller die 300 may include a controller die body 300B and a controller die dielectric layer 300D. The controller die dielectric layer 300D may be disposed to cover the controller die body 300B. The controller die 300 may include the circuit regions 320 and the through via region 330.

Controller die through via 350 may be conductive members that substantially vertically penetrate the controller die 300 or the controller die body 300B. The controller die through vias 350 may be disposed in the through via region 330 of the controller die 300. Each of the controller die through vias 350 may be include a vertical connection conductor such as a through silicon via (TSV). The controller die through vias 350 may be respectively electrically connected to the first connection pads 231 of the core die 200 through second inner connectors 520. The controller die through vias 350 may be electrically connected to the row decoders 221 and the column decoders (222 of FIG. 4) of the core die 200 through the first connection pads 231 and the first wirings 233.

The through via region 330 may be disposed to vertically overlap the pad region 230 of the core die 200. The controller die through vias 350 may be positioned to vertically overlap the first connection pads 231. The controller die through vias 350 may vertically overlap the first connection pads 231 on a one-to-one basis. Accordingly, compared to a case in which the controller die through vias and the first connection pads do not overlap each other, the lengths of the paths connecting the controller die through vias 350 and the first connection pads 231 can be effectively reduced.

The circuit region 320 of the controller die 300 may be a region separated from the through via region 330. The circuit region 320 may be a region in which logic circuits such as the controlling circuitry 310 are integrated, unlike the through via region 330. The controlling circuitry 310 may include logic circuits controlling the memory cell array of the controller die 300. The core die 200 includes the row decoders 221 and the column decoders 222, but might not include the logic circuits of the controlling circuitry. The controlling circuitry 310 of the controller die 300 may substantially control the operation of the core die 200.

The controlling circuitry 310 may be electrically connected to the controller die through vias 350 through second wirings 361. The row decoders 221 and the column decoders 222 may be electrically and signally connected to the controlling circuitry 310 through the second wirings 361, the controller die through vias 350, the second inner connector 520, and the first wirings 233.

The second wirings 361 may be provided in the controller die dielectric layer 300D. Fifth wirings 362 may be further provided in the controller die dielectric layer 300D. The fifth wirings 362 may be wirings separated from the second wirings 361. Fifth connection pads 365 connected to the first inner connectors 510 may be further disposed under a surface of the controller die dielectric layer 300D. The fifth wirings 362 may provide paths electrically connecting the fifth connection pads 365 and the controlling circuitry 310. Each of the second wirings 361 and the fifth wirings 362 may be formed in a multilayer metallization structure.

Figure 6:
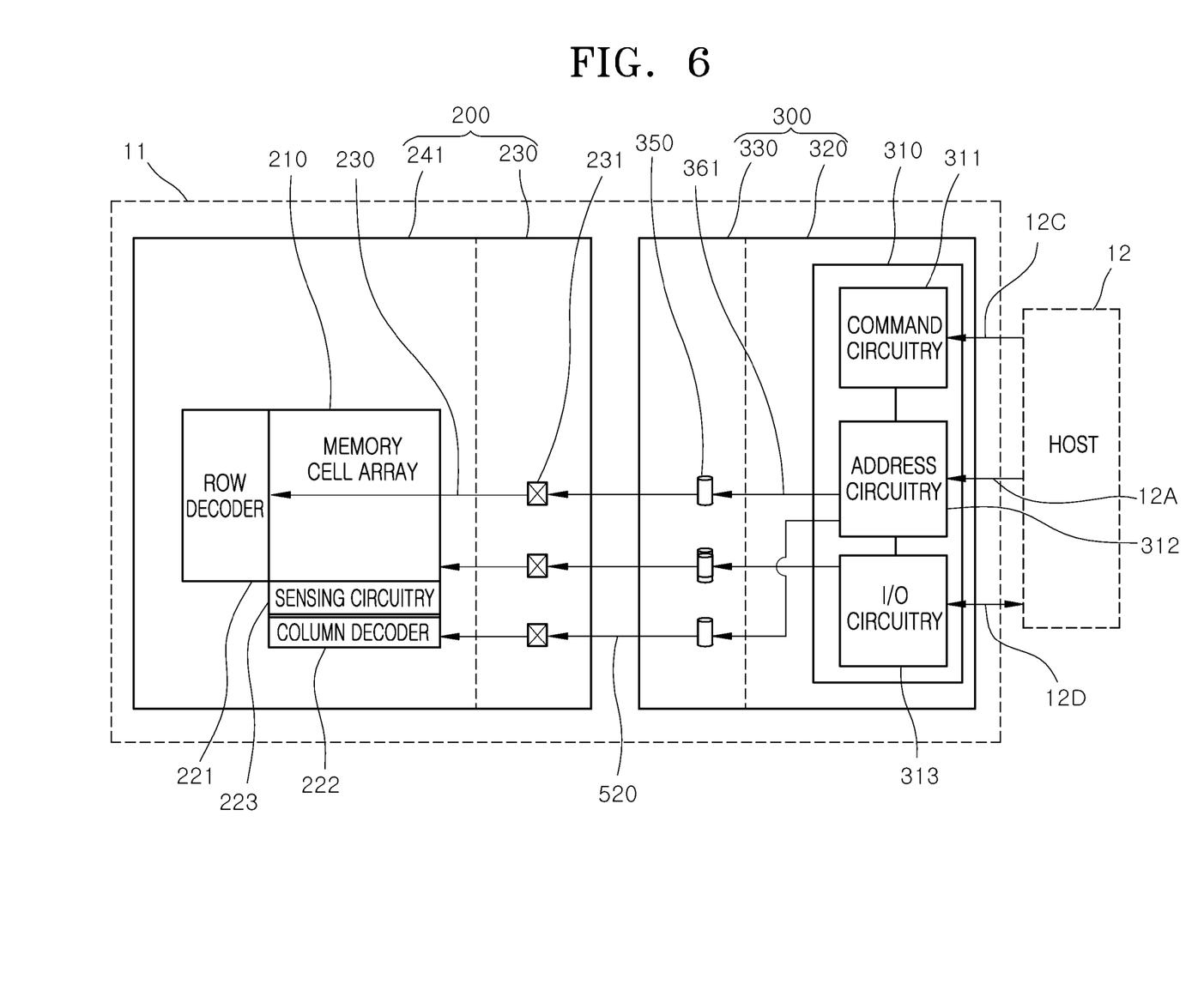
FIG. 6 is a block diagram illustrating a memory device including the core die and the controller die of FIG. 2.

FIG. 6 is a block diagram illustrating a memory device 11 including the core die 200 and the controller die 300 of FIG. 2.

Referring to FIGS. 6 and 2, the memory device 11 may include the core die 200 and the controller die 300. The core die 200 and the controller die 300 may include semiconductor dies separated from each other. The core die 200 may include banks 210 including a memory cell array and row decoders 221, column decoders 222, and a sensing circuitry 223 disposed around the banks 210, and may further include first connection pads 231 disposed on a pad region 230 and first wirings 233.

The controller die 300 may include controlling circuitry 310 for controlling the memory cell array of the core die 200, and may further include controller die through vias 350, and second wirings 361. The controlling circuitry 310 may include command circuitry 311, address circuitry 312, and data input and output circuitry 313. In an embodiment, the controlling circuitry 310 may include at least one command circuit included in the command circuitry 311, at least one address circuit included in the address circuitry 312, and at least one data input and output circuit included in the data input and output circuitry 313. The controlling circuitry 310 may further include circuit elements such as DC voltage generator or a delay locked loop (DLL).

The command circuitry 311 may decode an external command signal 12C received from an external host 12. The external command signal 12C may be used to control the memory cell array. The external command signal 12C may include a clock (CLK) signal, a clock enable (CKE) signal, a row address strobe (RAS) signal, a column address strobe (CAS) signal, a write enable (WE) signal, and a chip selection (CS) signal, etc. The command circuitry 311 may include a command buffer and a state machine. The command buffer may store the received command signal 12C, and the state machine may combine the received external command signal 12C, classify the address, and control the input and output of data.

The address circuitry 312 may decode the external address signal 12A received from the host 12. A row address may be transferred to the row decoder 221, and a column address may be transferred to the column decoder 222. The row decoder 221 may select a word line (WL in FIG. 3) in response to the row address, and the column decoder 222 may select a bit line (BL in FIG. 3) in response to the column address. Accordingly, a memory cell (211 in FIG. 3) positioned at the intersection of the word line WL and the bit line BL may be accessed.

The data input and output circuitry 313 may receive a data signal sensed by the sensing circuitry 233 and output a data signal 12D to the host 12. The data input and output circuitry 313 may transfer the data signal 12D received from the host 12 to the core die 200. The sensing circuitry 223 may include a plurality of sense amplifiers and input/output (I/O) gates. The input/output (I/O) gates may include I/O drivers for data input/output. The sense amplifiers may sense and amplify the data signal from the memory cell array to transfer the same to the input/output gates. The data signal may be transmitted to the data input/output circuitry 313 through the input/output gates.

The core die 200 and the controller die 300 that are separated from each other may be electrically and signally connected to each other by the second inner connectors 520. The paths formed by the first wirings 233, the first connection pads 231 and second inner connectors 520, the controller die through vias 350, and the second wirings 361 may connect the row decoder 221, the column decoder 222, and the sensing circuitry 223 to the controlling circuitry 310 of the controller die 300. Because the controller die through vias 350 and the first connection pads 231 overlap vertically with each other as illustrated in FIG. 2, the length of the electrical connection path between the core die 200 and the controller die 300 may be reduced compared to the case where the controller die through vias 350 and the first connection pads 231 do not overlap each other.

In a DRAM chip, a memory cell array and controlling circuitry may be integrated in a single chip. When the memory cell array and the controlling circuitry configure one chip, circuit elements constituting the controlling circuitry may be deteriorated in a process of forming capacitors constituting the memory cell array. In an embodiment, however, the core die 200 including the memory cell array and the controller die 300 including the controlling circuitry 310 for controlling the memory cell array may be configured with separated semiconductor dies from each other, so that the process of forming the controlling circuitry 310 of the controller die 300 might not be affected by the process of forming the memory cell array of the core die 200.

Figure 7:
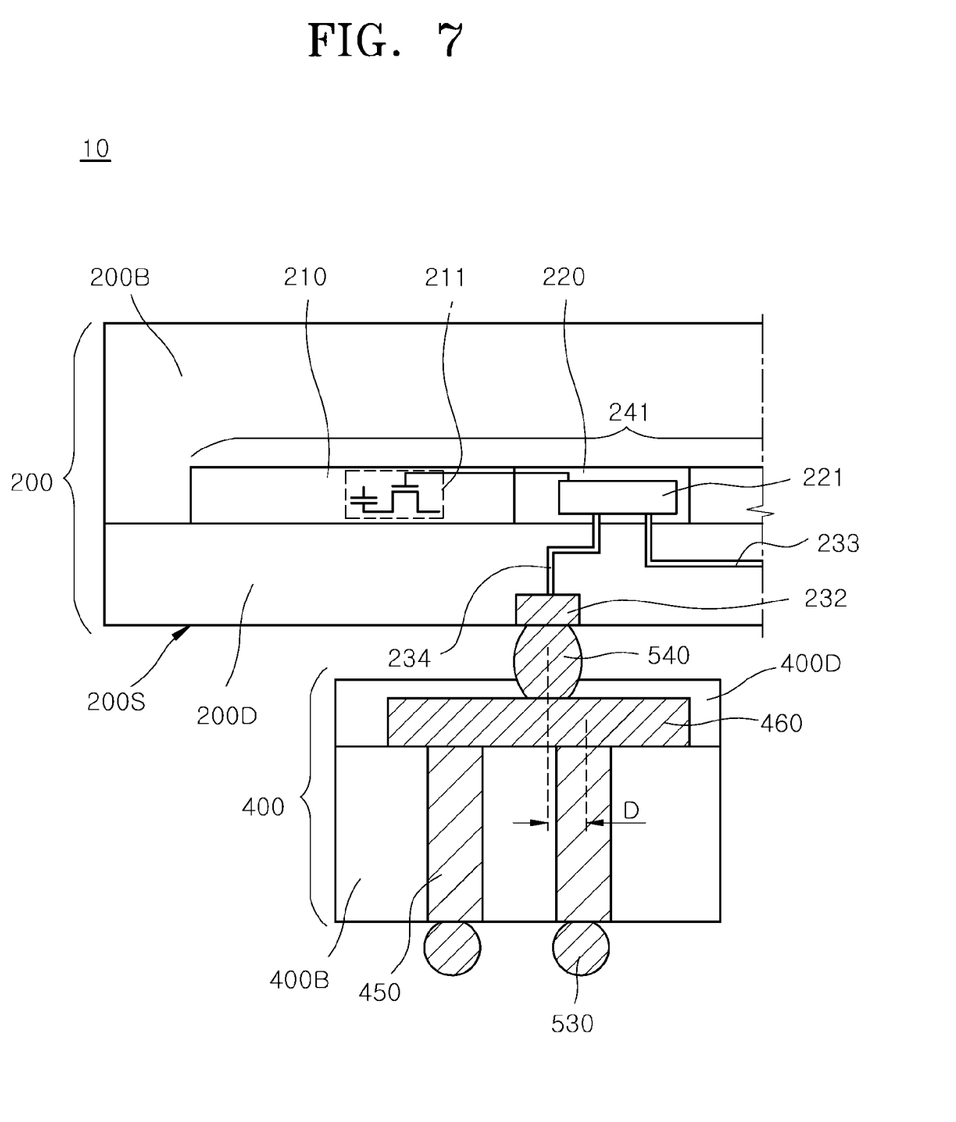
FIG. 7 is a cross-sectional view illustrating the enlarged core die and bridge die of the stack package of FIG. 1.
Figure 8:
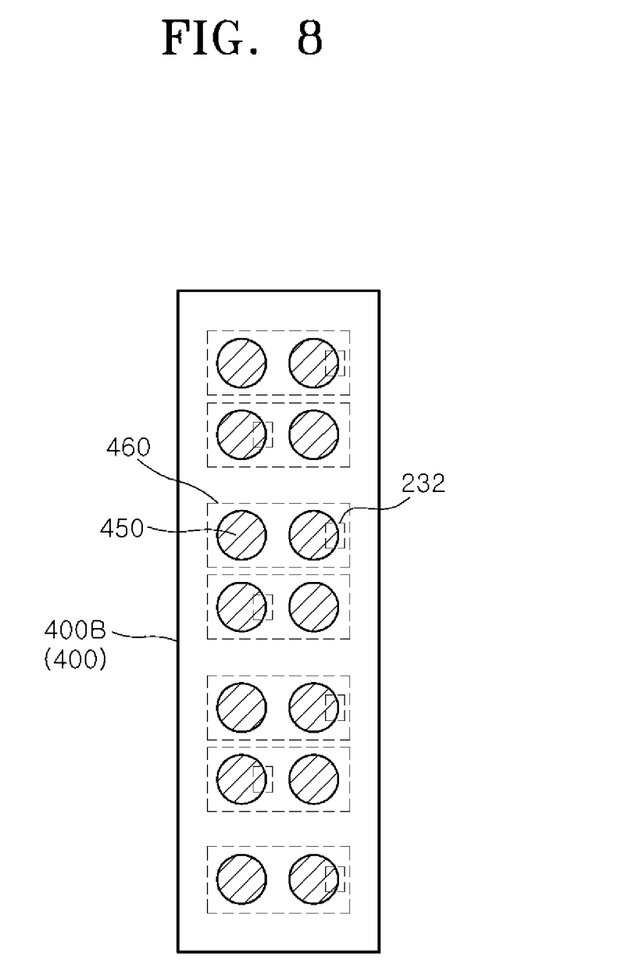
FIG. 8 is a plan view illustrating the arrangement of enlarged bridge die through vias of the bridge die of FIG. 7.

FIG. 7 is a cross-sectional view illustrating enlarged core die 200 and bridge die 400 of the stack package 10 of FIG. 1. FIG. 8 is a plan view illustrating the arrangement of the bridge die through vias 450 of the bridge die 400 of FIG. 7.

Referring to FIG. 7, the bridge die 400 may electrically connect the core die 200 to the package substrate (100 of FIG. 1). The bridge die 400 may connect the row decoders 221 and the column decoders (222 of FIG. 4) to the package substrate 100 electrically and directly without other die intervention. The bridge die 400 may be disposed to vertically overlap the core die 200. The bridge die 400 may be disposed to vertically overlap the bank 210 and the interbank region 220 of the core die 200.

The bridge die 400 may include a bridge die body 400B and a bridge die dielectric layer 400D. The bridge die dielectric layer 400D may be introduced as a layer covering a surface of the bridge die body 400B. The bridge die body 400B may be formed of a silicon (Si) material. The bridge die 400 may include bridge die through vias 450 substantially penetrating the bridge die body 400B. The bridge die through vias 450 may be introduced as TSV-type conductive connection members.

The bridge die through vias 450 may be electrically connected to the second connection pads 232 of the core die 200. The bridge die through vias 450 may be electrically connected to the package substrate (100 of FIG. 1) by the third inner connectors 530.

Referring to FIGS. 7 and 8, the bridge die through vias 450 might not vertically overlap the second connection pads 232, but may be positioned at a position offset by a predetermined distance D in a substantially horizontal direction to the second connection pads 232. In order to electrically connect the offset bridge die through vias 450 to the second connection pads 232, redistribution layer patterns 460 may be provided on the bridge die body 400B. Each of the redistribution layer patterns 460 may include a conductive pattern that is connected to the bridge die through via 450 and extends to a position perpendicular to the second connection pad 232. The word "predetermined" as used herein with respect to a parameter, such as a predetermined distance, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Fourth inner connectors 540 may connect the redistribution layer patterns 460 to the second connection pads 232. As the redistribution layer patterns 460 are introduced, the fourth inner connectors 540 may be positioned to be substantially vertically overlapped with the second connection pads 232, and may be positioned at a location substantially horizontally offset from the bridge die through vias 450. The redistribution layer patterns 460 may allow the bridge die through vias 450 to be disposed at other locations, not limited to the locations overlapping the second connection pads 232. Accordingly, positional freedom for the arrangement of the bridge die through vias 450 may be improved.

The redistribution layer patterns 460 may include conductive patterns that extend to connect two or more adjacent bridge die through vias 450 among the bridge die through vias 450 so that the plurality of the adjacent bridge die through vias 450 are electrically connected to one second connection pad 232. As such, the plurality of bridge die through vias 450 are electrically connected to one second connection pad 232, so that the resistance accompanying between the second connection pads 232 and the third inner connectors 530 can be reduced compared to a case in which only one bridge die through via is connected to the second connection pad 232.

Referring to FIG. 7 again, the bridge die through vias 450 and the redistribution layer patterns of the bridge die 400, the fourth inner connector 540, the second connection pad 232, and the fourth wiring 234 may provide an electrical first path connected to the memory cell array or the memory cell 211 from the package substrate (100 of FIG. 1) through the row decoder 221 or the column decoder (222 of FIG. 4). The bridge die 400, the bridge die through vias 450, or the redistribution layer patterns 460 may be positioned to overlap the second connection pad 232 and the second connection pad 232 may be disposed in the interbank region 220, so that the electrical first path may have a shortened path length than an electrical second path including the controller die (300 of FIG. 2), the first connection pad (231 of FIG. 2) of the core die (200 of FIG. 2), and the first wiring (233 of FIG. 2).

The bridge die 400 may be introduced as a member that forms a part of the electrical first path. The memory cell array or the memory cell 211 adjacent to the second connection pads 232 may be supplied with power or may be grounded through the electrical first path. The electrical first path has a shorter path than the second path, so that the first path may have a relatively low level of resistance than the second path. Voltage drop may occur during the operation of the memory cell 211 due to the resistance accompanying the power supply path. The supplying power to the memory cell array through the first path may involve relatively low resistance rather than the supplying power through the second path, so that the voltage drop that may be caused during the operation of the memory cell 211 can be reduced. Accordingly, it may be possible to improve operation delay or operation voltage margin reduction that may be accompanied by the voltage drop when the transistor of the memory cell 211 is operated.

Figure 9:
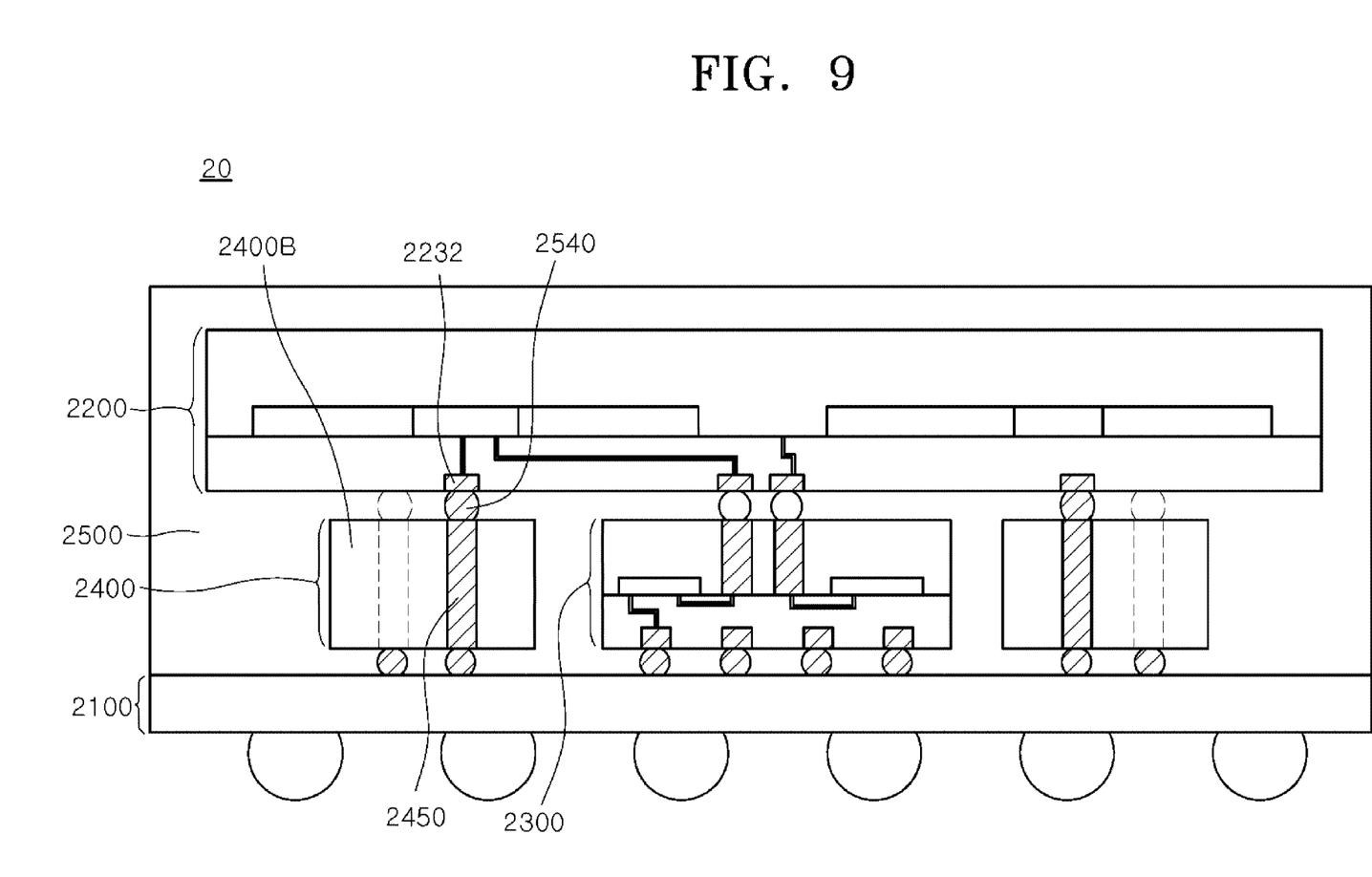
FIG. 9 is a cross-sectional view illustrating a stack package according to an embodiment of the present disclosure.

FIG. 9 is a cross-sectional view illustrating a stack package 20 according to an embodiment of the present disclosure.

Referring to FIG. 9, the stack package 20 may include a package substrate 2100, a core die 2200, a controller die 2300, bridge dies 2400, and an encapsulant 2500. The bridge die 2400 may include bridge die through vias 2450 penetrating a bridge die body 2400B. The bridge die through vias 2450 may be arranged at positions vertically overlapping second connection pads 2540 of the core die 2200, respectively. Accordingly, the redistribution layer patterns (460 of FIG. 7) can be omitted without introduction. The bridge die through vias 2450 may be respectively disposed at positions corresponding to the second connection pads 2540 on a one-to-one basis.

Figure 10:
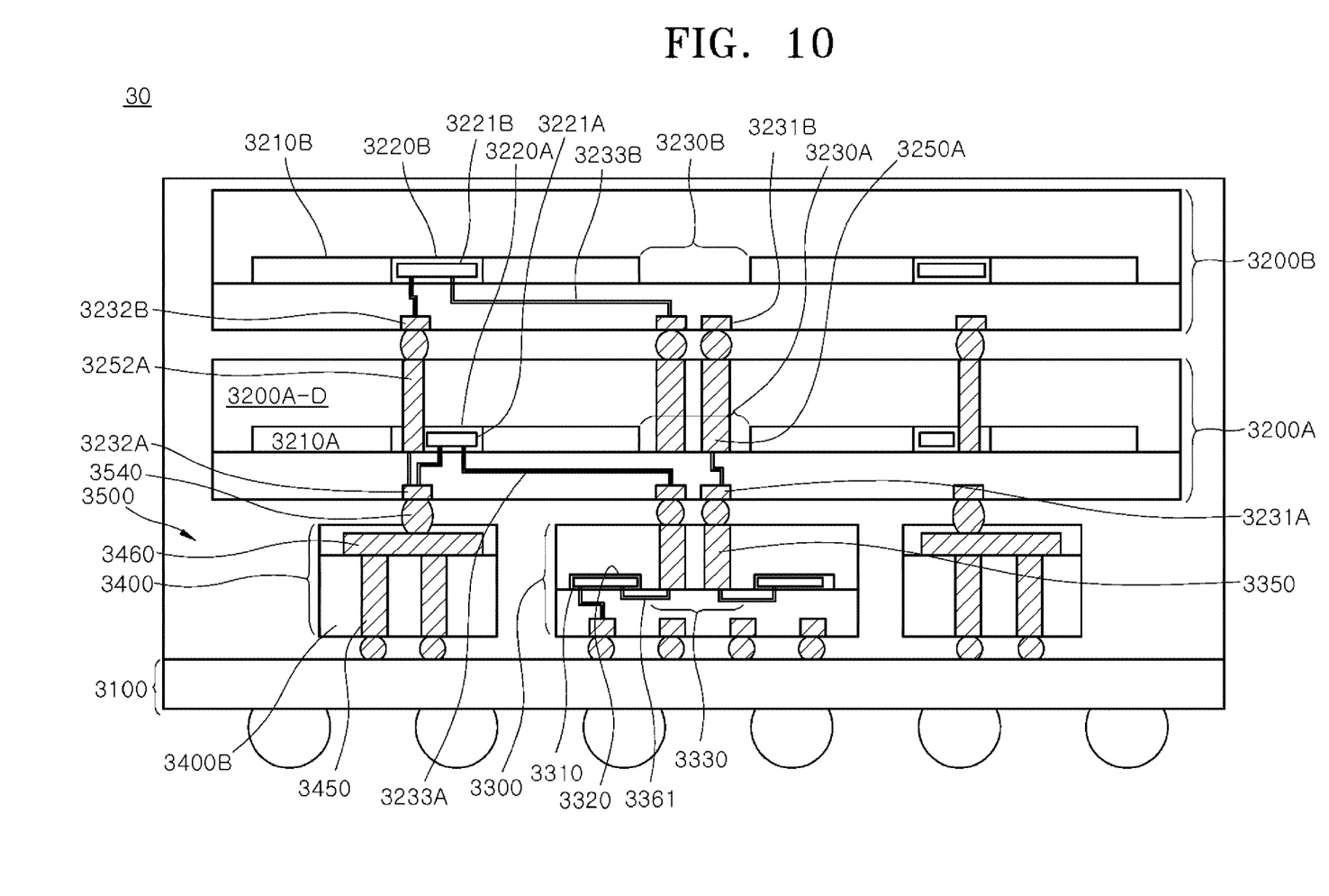
FIG. 10 is a cross-sectional view illustrating a stack package according to an embodiment of the present disclosure.

FIG. 10 is a cross-sectional view illustrating a stack package 30 according to an embodiment of the present disclosure.

Referring to FIG. 10, the stack package 30 may include a first core die 3200A disposed over a package substrate 3100. A second core die 3200B may be disposed over the first core die 3200A. A controller die 3300 may be disposed between the first core die 3200A and the package substrate 3100. The controller die 3300 may control the operations of the first and second core dies 3200A and 3200B together. Bridge dies 3400 may be disposed while being separated from the control die 3300. The bridge dies 3400 may be disposed between the first core die 3200A and the package substrate 3100 The stack package 30 may further include a encapsulant 3500.

The first core die 3200A may include first banks 3210A each including first memory cell arrays, first pad regions 3230A, and first interbank regions 3220A. First connection pads 3231A and first core die through vias 3250A may be disposed in the first pad region 3230A. Each of the first core die through vias 3250A may be introduced as a conductive member that substantially vertically penetrates first core die body 3200A-D of the first core die 3200A. Each of the first core die through vias 3250A may be introduced as a vertical connection member such as a TSV.

The first core die through vias 3250A may be electrically connected to the first connection pads 3231A. The first core die through vias 3250A may substantially penetrate the first core die 3200A and be electrically connected to the second core dies 3200B. The first core die through vias 3250A may be arranged to respectively overlap the first connection pads 3231A. Accordingly, the connection paths between the first core die through vias 3250A and the first connection pads 3231A can be reduced compared to the case where the first core die through vias 3250A and the first connection pads 3231A do not overlap each other.

First row decoders and first column decoders 3221A may be disposed in the first interbank region 3220A. The first row decoders and the first column decoders 3221A may be electrically connected to the first connection pads 3231A through first wirings 3233A. Second connection pads 3232A electrically connected to the first row decoders and first column decoders 3221A may be disposed in the first interbank region 3220A. Second core die through vias 3252A electrically connected to the second connection pads 3232A may be disposed in the first interbank region 3220A.

The second core die through vias 3252A may be disposed to penetrate substantially vertically a portion including the first interbank region 3220A of the first core die body 3200A-D. The second core die through vias 3252A may be electrically connected to the second connection pads 3232A and penetrate the first core die 3200A to be electrically connected to the second core die 3200B. The second core die through vias 3252A may be disposed to overlap the second connection pads 3232A, respectively. Accordingly, the connection path between the second core die through vias 3322A and the second connection pads 3232A can be reduced compared to the case where the second core die through vias 3322A and the second connection pads 3232A do not overlap each other.

The first core die 3200A may be an embodiment in which the first and second core die through vias 3250A and 3252A are introduced into the core die 200 described with reference to FIG. 2.

The controller die 3300 may include substantially the same configuration as the controller die 300 described with reference to FIG. 2.

The controller die 3300 may include a through via region 3330 and a circuit region 3320. Controller die through vias 3350 may be disposed in the through via region 3330 to penetrate the controller die 3330 to be electrically connected to first connection pads 3231A. Controlling circuitry 3310 may be disposed in the circuit region 3320, and the controlling circuitry 3310 may be electrically connected to the controller die through vias 3350 through second wirings 3361.

The second core die 3200B may include substantially the same configuration as the core die 200 described with reference to FIG. 2.

The second core die 3200B may include second banks 3210B each including second memory cell arrays. The second core die 3200B may further include a second pad region 3230B. Third connection pads 3231B electrically connected to the first core die through vias 3250A may be disposed in the second pad region 3230B. The second core die 3200B may further include second interbank regions 3220B. The second row decoders and the second column decoders 3221B electrically connected to the third connection pads 3231B through the third wirings 3233B may be disposed in the second interbank region 3220B. Fourth connection pads 3232B may be disposed in the second interbank region 3220B to be electrically connected to the second row decoders and the second column decoders 3221B while being connected to the second core through vias 3252A.

The bridge dies 3400 may include substantially the same configurations as the bridge dies (400 in FIGS. 2 and 2400 in FIG. 9) described with reference to FIGS. 2 and 9. In an embodiment, each of the bridge dies 3400 may include bridge die through vias 3450 that substantially penetrate a bridge die body 3400B and electrically connect the second connection pads 3232A of the first core die 3200A to the package substrate 3100. The bridge die through vias 3450 may be disposed at positions substantially horizontally offset to the second connection pads 3232A.

The bridge die 3400 may include redistribution layer patterns 3460 that are electrically connected to the offset bridge die through vias 3450 and extend to positions vertically overlapping the second connection pads 3232A. Each of the redistribution layer patterns 3460 may be a conductive pattern extending to connect the plurality of bridge die through vias 3450 to each other so that the plurality of bridge die through vias 3450 are electrically connected to one second connection pad 3232A. Inner connectors 3540 may electrically connect the second connection pads 3232A to the redistribution layer patterns 3460. The inner connectors 3540 may be substantially vertically overlapped with the second connection pads 3232A, and may be positioned at positions substantially horizontally offset from the bridge die through vias 3450.

The bridge die through vias 3450 of the bridge die 3400 are depicted in offset shapes with the second connection pads 3232A in FIG. 10, but in another embodiment, the bridge die through vias 3450 may be vertically overlapped with the second connection pads 3232A, such as depicted in FIG. 9.

Figure 11:
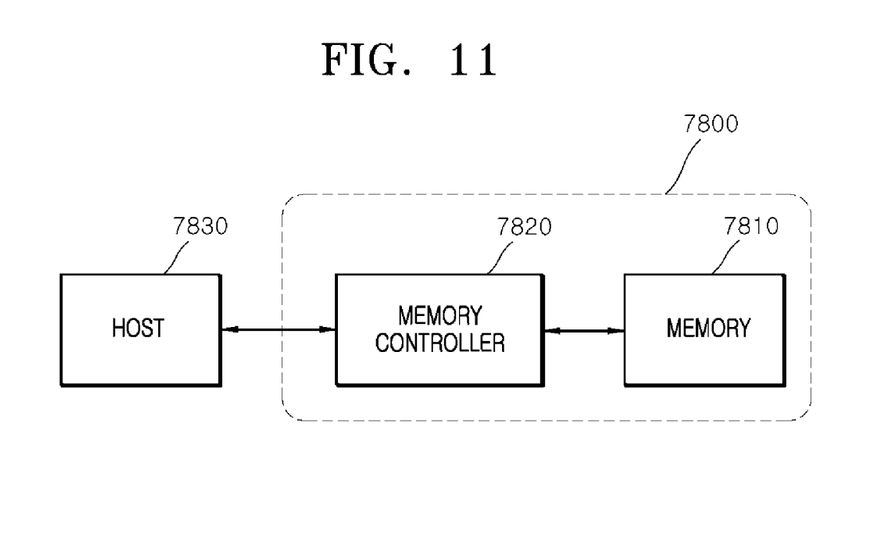
FIG. 11 is a block diagram illustrating an electronic system employing a memory card including a package in accordance with an embodiment.

FIG. 11 is a block diagram illustrating an electronic system including a memory card 7800 employing at least one of semiconductor packages according to the embodiments.

The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 12:
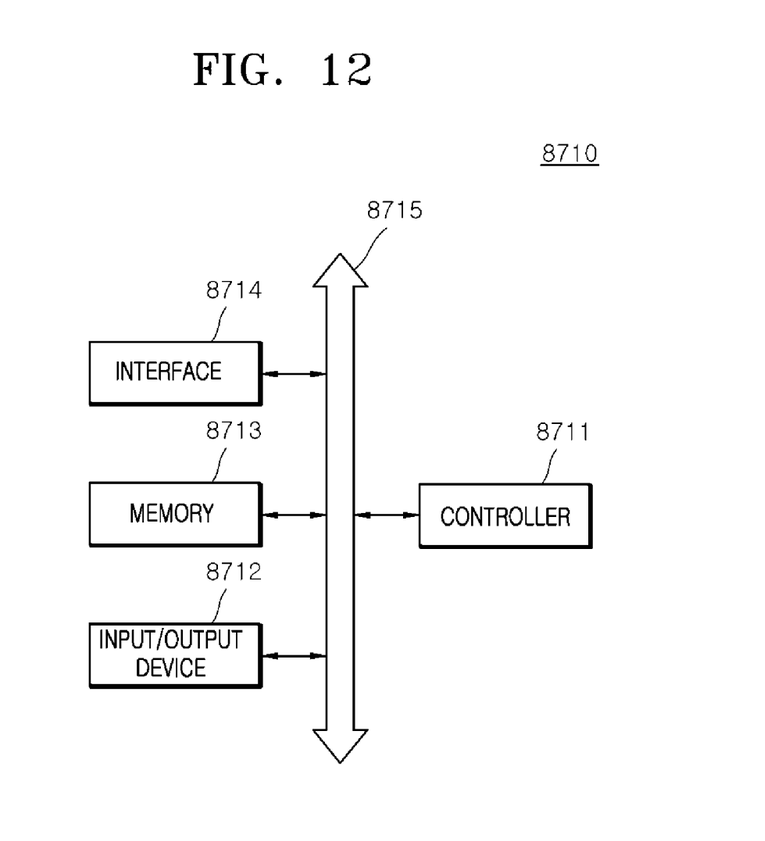
FIG. 12 is a block diagram illustrating an electronic system including a package according to an embodiment.

FIG. 12 is a block diagram illustrating an electronic system 8710 including at least one of semiconductor packages according to the embodiments.

The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

The concepts have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the concepts are not limited to the above descriptions but defined by the accompanying claims, and all of distinctive features in the equivalent scope should be construed as being included in the concepts.

What is claimed is:

1. A stack package comprising:
    a first core die disposed over a package substrate;
    a second core die disposed over the first core die;
    a controller die disposed between the first core die and the package substrate, and controlling the first and second core dies; and
    a bridge die spaced apart from the controller die,
    wherein the first core die comprises:
    first banks each including first memory cell arrays;
    a first pad region in which first connection pads and first core die through vias are arranged; and
    a first interbank region in which first row decoders and first column decoders electrically connected to the first connection pads through first wirings, second connection pads electrically connected to the first row decoders and first column decoders, and second core die through vias are arranged, and
    wherein the controller die comprises:
    a through via region in which controller die through vias penetrating the controller die to be connected to the first connection pads are disposed; and
    a circuit region in which controlling circuitry electrically connected to the controller die through vias through second wirings are disposed, and
    wherein the bridge die electrically connects the package substrate to the first row decoders and first column decoders through the second connection pads.

2. The stack package of claim 1, wherein the first core die through vias are connected to the first connection pads and penetrate the first core die to be connected to the second core die, and
    wherein the second core die through vias are connected to the second connection pads and penetrate the first core die to be connected to the second core die.

3. The stack package of claim 2, wherein the first core die through vias are disposed to overlap the first connection pads, and the second core die through vias are disposed to overlap the second connection pads.

4. The stack package of claim 1, wherein the second core die comprises:
    second banks each including second memory cell arrays;
    a second pad region in which third connection pads connected to the first core die through vias are disposed; and
    a second interbank region in which second row decoders and second column decoders electrically connected to the third connection pads through third wirings, fourth connection pads electrically connected to the second row decoders and second column decoders are arranged.

5. The stack package of claim 1, wherein the bridge die is disposed between the first core die and the package substrate,
    wherein the bridge die comprises:
    a bridge die body; and
    bridge die through vias substantially penetrating the bridge die body to electrically connect the second connection pads to the package substrate.

6. The stack package of claim 5, wherein the bridge die through vias are disposed at positions vertically overlapped with the second connection pads.

7. The stack package of claim 5, wherein the bridge die through vias are disposed at positions substantially offset in the horizontal direction from the second connection pads,
    wherein the bridge die further comprises redistribution layer patterns electrically connected to the offset bridge die through vias and extending to positions vertically overlapped with the second connection pads.

8. The stack package of claim 7, wherein each of the redistribution layer patterns extends to the plurality of bridge die through vias so that the plurality of bridge die through vias are electrically connected to one of the second connection pads.

9. The stack package of claim 8, further comprising inner connectors that electrically connect the redistribution layer patterns to each other, overlap substantially vertically the second connection pads, and are positioned at positions offset from the bridge die through vias in a substantially horizontal direction.

10. The stack package of claim 1, wherein the controller circuitry comprises:
    at least one command circuit configured for receiving and decoding an external command signal;
    at least on address circuit configured for receiving an external address signal; and
    at least one input and output circuit.

* * * * *